US008758638B2

(12) United States Patent
Ye et al.

(10) Patent No.: US 8,758,638 B2
(45) Date of Patent: Jun. 24, 2014

(54) COPPER OXIDE REMOVAL TECHNIQUES

(75) Inventors: Weifeng Ye, Sunnyvale, CA (US);
Victor Nguyen, Novato, CA (US);
Mei-Yee Shek, Palo Alto, CA (US);
Mihaela Balseanu, Sunnyvale, CA (US); Li-Qun Xia, Cupertino, CA (US);
Derek R. Witty, Fremont, CA (US)

(73) Assignee: Applied Materials, Inc., Santa Clara, CA (US)

( * ) Notice: Subject to any disclaimer, the term of this patent is extended or adjusted under 35 U.S.C. 154(b) by 180 days.

(21) Appl. No.: 13/104,314

(22) Filed: May 10, 2011

(65) Prior Publication Data

US 2012/0289049 A1 Nov. 15, 2012

(51) Int. Cl.
*H01L 21/3065* (2006.01)
*H01L 21/302* (2006.01)

(52) U.S. Cl.
USPC ...... 216/78; 438/694; 438/708; 257/E21.214; 257/E21.218

(58) Field of Classification Search
None
See application file for complete search history.

(56) References Cited

U.S. PATENT DOCUMENTS

| | | | | |
|---|---|---|---|---|
| 5,431,774 | A * | 7/1995 | Douglas | 216/57 |
| 5,614,060 | A * | 3/1997 | Hanawa | 438/720 |
| 6,110,287 | A * | 8/2000 | Arai et al. | 156/345.34 |
| 6,255,217 | B1 * | 7/2001 | Agnello et al. | 438/687 |
| 6,355,571 | B1 | 3/2002 | Huang et al. | |
| 6,368,678 | B1 * | 4/2002 | Bluck et al. | 427/569 |
| 6,500,761 | B1 * | 12/2002 | Wajda et al. | 438/685 |
| 6,667,231 | B1 * | 12/2003 | Wu | 438/628 |
| 6,743,310 | B1 * | 6/2004 | Ngo | 148/525 |
| 6,764,951 | B1 * | 7/2004 | van Ngo | 438/687 |
| 7,084,063 | B2 | 8/2006 | Noguchi et al. | |
| 7,217,654 | B2 * | 5/2007 | Nagahara et al. | 438/637 |
| 7,365,005 | B1 * | 4/2008 | Gadgil | 438/637 |
| 7,553,772 | B1 * | 6/2009 | Gu et al. | 438/709 |
| 7,566,661 | B2 * | 7/2009 | Lavoie | 438/681 |
| 8,173,537 | B1 * | 5/2012 | Chattopadhyay et al. | 438/618 |
| 8,202,500 | B2 * | 6/2012 | Fahs et al. | 423/210 |
| 2001/0049181 | A1 | 12/2001 | Rathi et al. | |
| 2002/0123237 | A1 * | 9/2002 | Nguyen et al. | 438/761 |
| 2003/0032292 | A1 * | 2/2003 | Noguchi | 438/692 |
| 2003/0132198 | A1 * | 7/2003 | Ono et al. | 216/69 |
| 2005/0048768 | A1 * | 3/2005 | Inoue et al. | 438/629 |
| 2005/0170653 | A1 * | 8/2005 | Horiuchi et al. | 438/689 |
| 2006/0024979 | A1 * | 2/2006 | Tabuchi | 438/788 |
| 2006/0121733 | A1 * | 6/2006 | Kilpela et al. | 438/681 |
| 2006/0189133 | A1 * | 8/2006 | Dimitrakopoulos et al. | 438/687 |
| 2007/0035029 | A1 * | 2/2007 | Caubet et al. | 257/762 |
| 2007/0175856 | A1 * | 8/2007 | Johnson et al. | 216/2 |
| 2007/0197032 | A1 * | 8/2007 | Owada et al. | 438/685 |
| 2007/0228570 | A1 * | 10/2007 | Dimitrakopoulos et al. | 257/754 |
| 2008/0102613 | A1 * | 5/2008 | Elers | 438/584 |

(Continued)

OTHER PUBLICATIONS

Jose' A. Rodriguez et al., Reduction of CuO in H2: in situ time-resolved XRD studies, Catalysis Letters vol. 85, Nos. 3-4, Feb. 2003.

*Primary Examiner* — Allan Olsen
(74) *Attorney, Agent, or Firm* — Patterson & Sheridan, LLP

(57) ABSTRACT

A method for the removal of copper oxide from a copper and dielectric containing structure of a semiconductor chip is provided. The copper and dielectric containing structure may be planarized by chemical mechanical planarization (CMP) and treated by the method to remove copper oxide and CMP residues. Annealing in a hydrogen ($H_2$) gas and ultraviolet (UV) environment removes copper oxide, and a pulsed ammonia plasma removes CMP residues.

24 Claims, 4 Drawing Sheets

(56) References Cited

U.S. PATENT DOCUMENTS

| | | | |
|---|---|---|---|
| 2008/0102621 A1* | 5/2008 | Yoon et al. | 438/618 |
| 2008/0182410 A1* | 7/2008 | Elers et al. | 438/685 |
| 2008/0182411 A1* | 7/2008 | Elers | 438/685 |
| 2008/0260963 A1* | 10/2008 | Yoon et al. | 427/534 |
| 2009/0000942 A1* | 1/2009 | Bai et al. | 204/164 |
| 2009/0029528 A1* | 1/2009 | Sanchez et al. | 438/476 |
| 2009/0047795 A1* | 2/2009 | Matsudo et al. | 438/729 |
| 2009/0294061 A1* | 12/2009 | Shannon et al. | 156/345.24 |
| 2010/0140221 A1* | 6/2010 | Kikuchi | 216/67 |
| 2010/0308463 A1* | 12/2010 | Yu et al. | 257/753 |
| 2010/0317198 A1* | 12/2010 | Antonelli et al. | 438/758 |
| 2011/0065273 A1* | 3/2011 | Yoon et al. | 438/643 |
| 2011/0100954 A1* | 5/2011 | Satake et al. | 216/22 |
| 2011/0111533 A1* | 5/2011 | Varadarajan et al. | 438/4 |
| 2011/0139748 A1* | 6/2011 | Donnelly et al. | 216/37 |
| 2011/0263117 A1* | 10/2011 | Nam et al. | 438/627 |
| 2012/0175147 A1* | 7/2012 | Nakako et al. | 174/133 R |
| 2012/0196048 A1* | 8/2012 | Ueda | 427/532 |
| 2012/0252219 A1* | 10/2012 | Morimoto et al. | 438/710 |
| 2012/0289049 A1* | 11/2012 | Ye et al. | 438/694 |
| 2012/0289053 A1* | 11/2012 | Holland et al. | 438/711 |

* cited by examiner

US 8,758,638 B2

COPPER OXIDE REMOVAL TECHNIQUES

BACKGROUND OF THE INVENTION

1. Field of the Invention

Embodiments of the present invention generally relate to methods for the removal of copper oxides during semiconductor fabrication.

2. Description of the Related Art

The dielectric constant (k) of interlayer dielectric (ILD) films is continually decreasing as device scaling continues. Minimizing integration damage on low dielectric constant (low-k) films is important to be able to continue decreasing feature sizes. However, as feature sizes shrink, improvement in the resistive capacitance and reliability of ILD films becomes a serious challenge.

Current techniques for the removal of copper oxides (CuO) and chemical mechanical planarization (CMP) residues involve the use of ammonia ($NH_3$) or hydrogen ($H_2$) plasmas. Removal of the copper oxides and CMP residues are necessary to improve the electromigration (EM) of the metallization structures and the time dependent dielectric breakdown (TDDB) of the ILD films. Also, leftover copper oxides and CMP residues can reduce adhesion to subsequently formed layers. However, exposing low-k films to $NH_3$ and $H_2$ plasmas modifies the ILD film and increases the k value.

Thus, a new method for the removal of copper oxides and CMP residues is necessary to minimize the k value increase of low-k films.

SUMMARY OF THE INVENTION

Embodiments of the invention generally provide a method for the removal of copper oxide.

In one embodiment, a method of treating a copper and dielectric containing structure is provided. A copper and dielectric containing structure is exposed to a hydrogen gas and ultraviolet (UV) radiation concurrently. The copper and dielectric containing structure is also exposed to a pulsed ammonia plasma.

In another embodiment, a copper and dielectric containing structure is exposed to a hydrogen ($H_2$) gas and ultraviolet (UV) radiation concurrently by positioning the copper and dielectric containing structure in a first processing volume of a first processing chamber, flowing the hydrogen gas into the first processing volume, and engaging a source of UV radiation to expose the copper and dielectric containing structure to the UV radiation. The copper and dielectric containing structure is also exposed to a pulsed ammonia plasma by positioning the copper and dielectric containing structure in a second processing volume of a second processing chamber, flowing an ammonia gas into the second processing volume, and coupling RF power to the ammonia gas to form the pulsed ammonia plasma.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

DETAILED DESCRIPTION

Embodiments of the present invention generally provide methods for the removal of copper oxides during semiconductor fabrication. Embodiments of the present invention also provide methods for the removal of byproducts formed during chemical mechanical planarization (CMP). Such byproducts include copper oxides formed on the metallization structures and residues from CMP processes, such as electrolyte slurry compounds.

Figure 1:
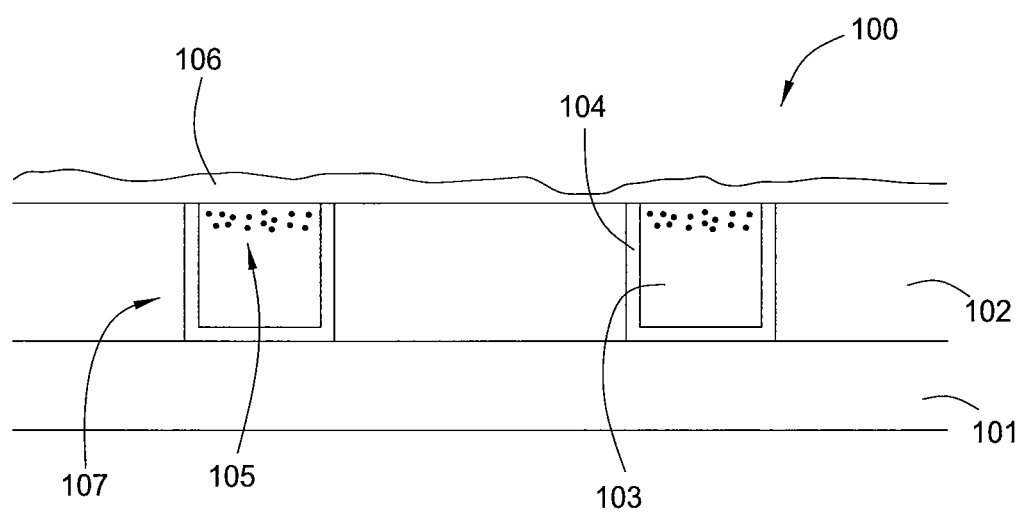
FIG. 1 illustrates a cross-sectional view of one embodiment of a device structure.

FIG. 1 illustrates a cross-sectional view of one embodiment of a device structure 100 after being planarized by a CMP process. The device structure 100 may be an interconnect structure for a semiconductor chip. The structure 100 generally includes a substrate 101, an interlayer dielectric (ILD) 102, and copper material 103 formed in features 107 of the interlayer dielectric 102. The structure 100 may be created by depositing the interlayer dielectric 102 onto the substrate 101 in a continuous layer, etching the interlayer dielectric 102 to form the features 107 therein, depositing a diffusion barrier 104 into the features 107 of the interlayer dielectric 102, and depositing the copper material 103 into the features 107 of the interlayer dielectric 102. The interlayer dielectric 102 may be formed from a low-k material such as silicon oxide, silicon oxynitride, silicon carbon oxide, silicon carbon nitride, or other suitable materials. The interlayer dielectric 102 may have a k value of 5 or less, such as 3 or less. The copper material 103 may be high purity copper or a copper alloy, such as copper-aluminum, copper-manganese, or other related alloys. The diffusion barrier 104 may be formed from, for example, Ta/TaN, TiN/Ti, or other suitable materials.

Excess copper material may be deposited outside the features 107 of the interlayer dielectric 102. To remove the excess copper material, and to make the thickness of the structure 100 even, a CMP process may be used. The CMP process may cause copper oxide (CuO) 105 to form on an upper portion of the copper material 103. The CMP process may also leave residues 106 on the structure 100, such as, for example, carbon containing compounds from a CMP slurry. The copper oxide 105 and CMP residues 106 can negatively affect the electrical conductivity of the copper material 103 and adhesion of subsequent layers formed on the structure 100.

Figure 2:
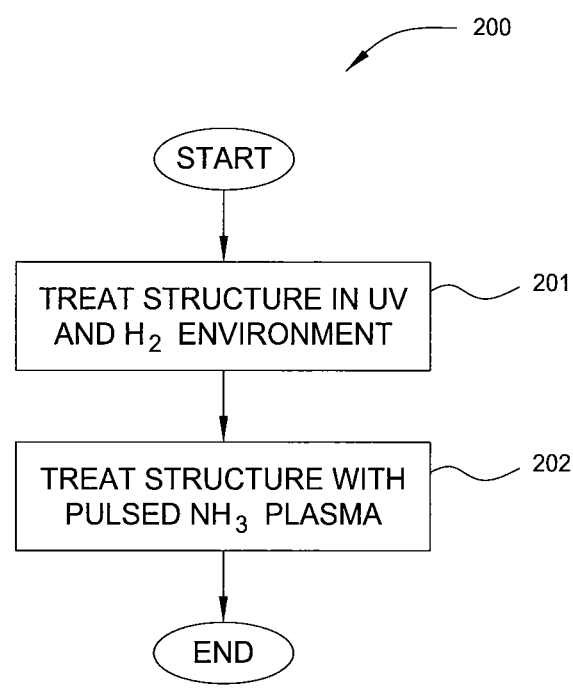
FIG. 2 is a flow chart illustrating one embodiment of a method of the present invention.
Figure 3A:
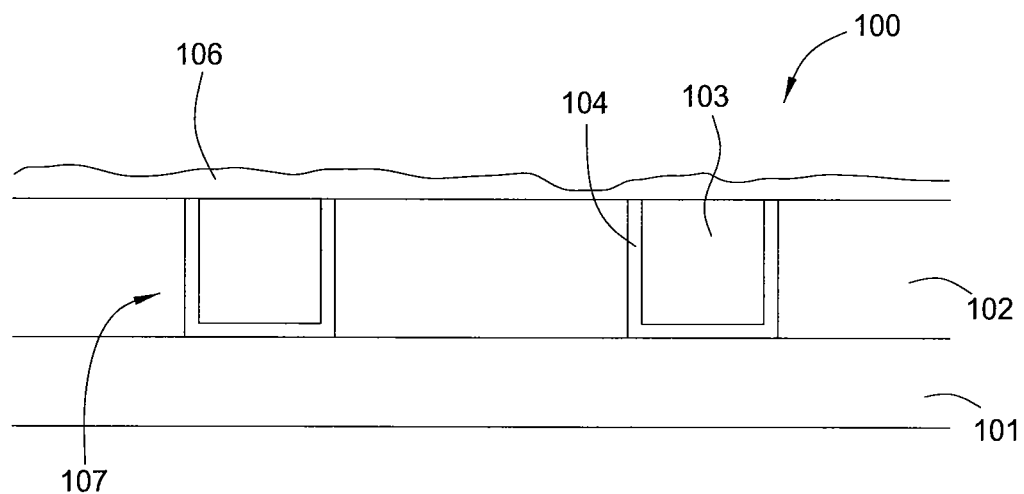
FIGS. 3A-3B illustrate cross-sectional views of the device structure of FIG. 1 during various stages of the method shown in FIG. 2.
Figure 3B:
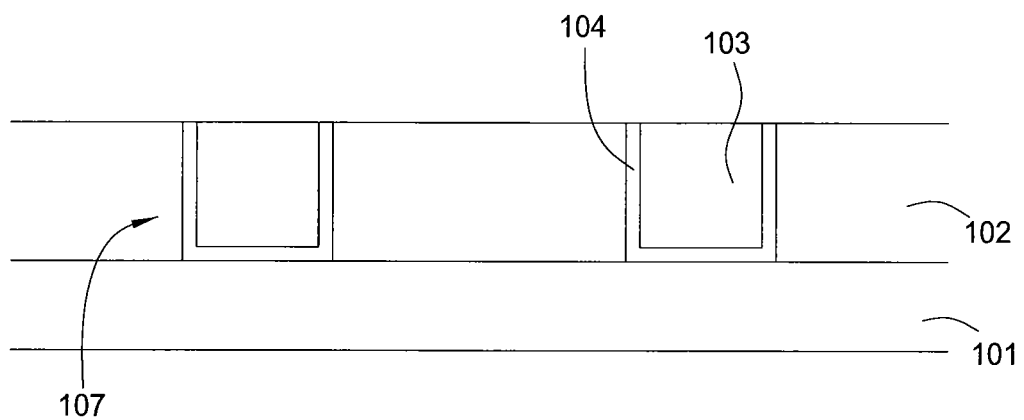

FIG. 2 is a flow chart illustrating one embodiment of a copper oxide and CMP residue removal method 200. FIGS. 3A-3B illustrate cross-sectional views of the device structure 100 during various stages of the method 200. The method 200 may be used to remove copper oxides and CMP residues while also minimizing increases in the k value of dielectrics and reducing Cu Hillock effects.

Referring now to FIGS. 1, 2, and 3A, the structure 100 is treated by a hydrogen ($H_2$) annealing process, as shown in block 201 of the method 200. The hydrogen annealing process may be conducted by exposing the structure 100 to hydrogen gas ($H_2$) while concurrently heating the structure with ultraviolet (UV) radiation. The structure 100 may be additionally heated by other outside sources. The structure

100 may initially be at a temperature below the optimal temperature for the hydrogen annealing process due to transfer time from a CMP processing area to a hydrogen annealing process area. The application of UV radiation quickly heats the substrate to an appropriate temperature for reaction of the hydrogen gas with the copper oxide 105. The hydrogen annealing process may be optimized for removal of the copper oxide 105. FIG. 3A illustrates the structure 100 after being processed according to the processes of the block 201 of the method 200.

The hydrogen annealing process may be performed in an UV processing chamber, such as the NANOCURE™ chamber, coupled to the Producer® GT™ or Producer® SE systems commercially available from Applied Materials, Inc., located in Santa Clara, Calif. In one embodiment, the structure 100 is positioned in a processing volume of a processing chamber. Hydrogen gas may then flow into the processing volume, and a source of UV radiation may be engaged, to expose the structure 100 to UV radiation and the hydrogen gas.

For a 300 mm diameter substrate, the hydrogen annealing process may be conducted at a chamber pressure between 2 Torr and 10 Torr, such as 7.5 Torr, a substrate temperature between 200° C. and 400° C., such as 350° C., an UV irradiance power between 1000 W/m$^2$ and 2000 W/m$^2$, UV wavelengths between 200 nm and 400 nm, such as 360 nm, a hydrogen gas flow rate between 1000 sccm and 10,000 sccm, such as 4000 sccm, and an annealing treatment time between 1 second and 60 seconds, such as 15 seconds. The annealing treatment time for the hydrogen annealing process is defined as the time in which the substrate is actively being treated with the hydrogen gas and UV radiation. The hydrogen annealing process may also preheat the structure 100 for subsequent processing. The hydrogen annealing process described above removes the copper oxide 105 while not significantly increasing the k value of the interlayer dielectric 102.

Referring now to FIGS. 2 and 3B, the structure 100 is treated with a pulsed ammonia (NH$_3$) plasma, as shown in block 202 of the method 200. The ammonia plasma may be created by coupling radio frequency (RF) power to an ammonia gas. The RF power may be inductively or capacitively coupled to the ammonia gas. The plasma may be actively pulsed (e.g., repeatedly ignited and extinguished) to treat the structure 100. The pulsed ammonia plasma may be optimized for removal of the CMP residues 106, but may also remove copper oxide not removed during the processes of block 201 of the method 200. FIG. 3B illustrates the structure 100 after being processed according to the block 202 of the method 200.

The pulsed ammonia plasma process may be conducted in plasma processing chamber, such as the Producer® BLOK™ PECVD chamber, coupled to the Producer® GT™ or Producer® SE systems commercially available from Applied Materials, Inc., located in Santa Clara, Calif. In one embodiment, the structure 100 may be positioned in a processing volume of a processing chamber. An ammonia gas may then flow into the processing volume, and a RF power source may be coupled to the ammonia gas to form a pulsed ammonia plasma to expose the structure 100 to the pulsed ammonia plasma.

For a 300 mm diameter substrate, the pulsed ammonia plasma process may be conducted at a chamber pressure between 2 Torr and 4 Torr, such as 2.6 Torr, a substrate temperature between 200° C. and 400° C., such as 350° C., a RF power between 300 W and 1000 W, such as 550 W, a RF power frequency between 300 kHz and 15 MHz, such as 13.56 MHz, an ammonia gas flow rate between 1000 sccm and 3000 sccm, such as 2500 sccm, a pulse frequency between 1 Hz and 50 kHz, such as 200 Hz, a plasma treatment time between 1 second and 400 seconds, such as 20 seconds, and a duty cycle between 1% and 100%, such as 20%. In one embodiment, the ammonia gas may be mixed with a nitrogen (N$_2$) carrier gas. The nitrogen gas may be supplied at a flow rate between 1000 sccm and 10,000 sccm, such as 1500 sccm. The pulse frequency is defined as the frequency in which the ammonia plasma is pulsed (e.g., ignited and extinguished). The plasma treatment time of the pulsed ammonia process is defined as the total time in which the structure 100 is processed, and the duty cycle defines the total time in which the ammonia plasma is actively pulsed within the plasma treatment time. It has been found by the inventors that a short amount of pulsed ammonia plasma time, such as 4 seconds, can effectively remove CMP residues while minimizing increases in the k value of the interlayer dielectric 102.

Figure 4A:
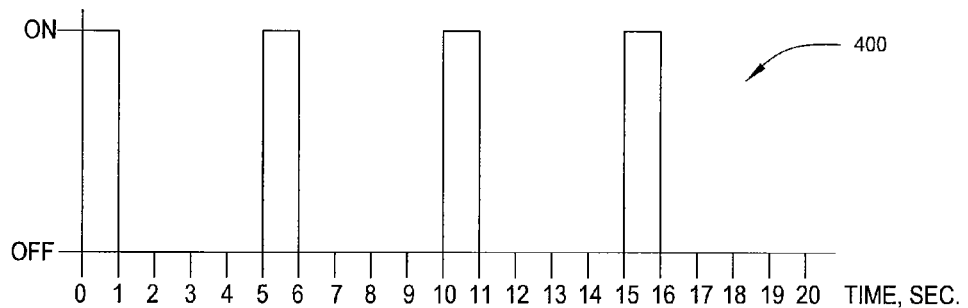
FIGS. 4A-4C illustrate embodiments of processing timelines.
Figure 4B:
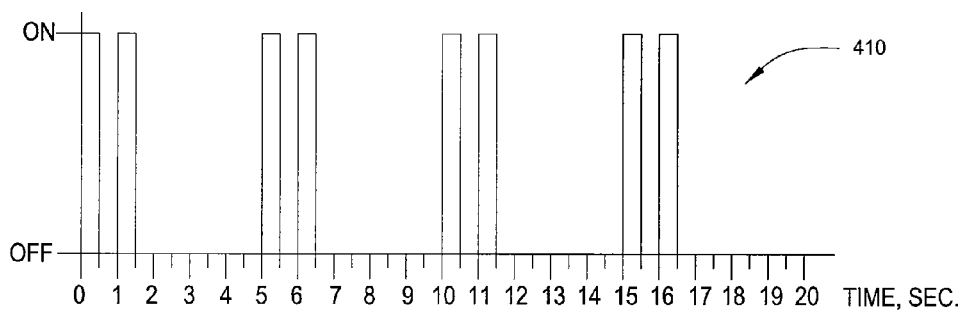
Figure 4C:
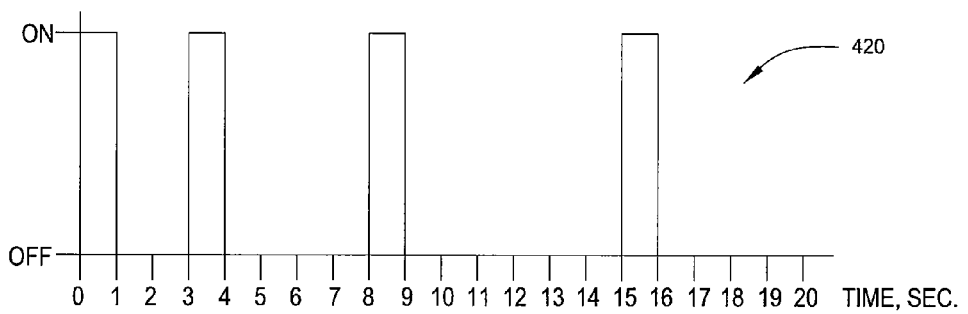

Referring to FIGS. 4A-4C, the structure 100 may be treated for a treatment time of 20 seconds at a duty cycle of 20%, which means that the ammonia plasma is actively pulsed for a total of 4 seconds within the 20 second treatment time span. In one embodiment, the ammonia plasma may be pulsed for 1 second and turned off for 4 seconds, and the pattern may be repeated until a total treatment time of 20 seconds is reached, as shown by the process timeline 400 in FIG. 4A. The total active pulse time may be evenly divided into divisions which may be evenly distributed within the treatment time. The total active pulse time may be divided into uneven divisions and/or unevenly distributed within the treatment time. The total time may be divided into a number of divisions between 2 and 50000, such as 4 divisions shown in the process timeline 400. In another embodiment, the ammonia plasma may be pulsed eight times for 0.5 seconds, as shown by the process timeline 410 in FIG. 4B. In yet another embodiment, the ammonia plasma may be pulsed in a non-uniformly distributed pattern, as shown by the process timeline 420 in FIG. 4C. The present invention should not be limited to the embodiments described above, as a range of treatment times, duty cycles, and process timelines are possible. As such, the pulsed ammonia plasma process may further be tuned to lengthen or shorten the processing time in order to, for example, accommodate for the timing of other processes used to form the structure 100, or other subsequent processes.

In one embodiment, the processes of the block 202 of the method 200 are performed prior to the processes of the block 201 of the method 200.

In one embodiment, the processes of the blocks 201 and 202 of the method 200 may be conducted in separate processing chambers. Alternatively, the processes of the blocks 201 and 202 of the method 200 may be conducted in the same processing chamber. A processing chamber capable of performing the processes of the blocks 201 and 202 of the method 200 may include both an UV radiation source and a RF power source. For example, the chamber may include a chamber body made of aluminum and a quartz window formed on one side of the chamber body. The chamber body and quartz window define a processing volume, and a substrate support pedestal may be disposed inside the processing volume opposite the quartz window. An UV lamp may be disposed outside the processing volume, and facing the quartz window and substrate support pedestal. A RF antenna may be coiled around an outside perimeter of the chamber body and coupled to a RF power source. The coiled antenna may be positioned between the substrate support pedestal and the quartz window. A gas panel may be coupled to the chamber and may be configured to supply processing gases, such as those required by the processes of the blocks 201 and 202 of the method 200 described above, to the processing volume.

Referring back to FIGS. 1 and 3A-3B, once the copper oxide 105 and CMP residues 106 have been removed from the structure 100, further processing may be done to form additional layers or structures onto the structure 100. For example, a copper diffusion barrier layer, such as BLOk™ which is commercially available from Applied Materials, Inc., located in Santa Clara, Calif., may be formed onto the structure 100.

The method 200 effectively removes copper oxides and CMP residues while minimizing increases in the k value of dielectric materials.

While the foregoing is directed to embodiments of the present invention, other and further embodiments of the invention may be devised without departing from the basic scope thereof, and the scope thereof is determined by the claims that follow.

The invention claimed is:

1. A method of removing copper oxide from a copper and dielectric containing structure, comprising:
    positioning a substrate containing a copper and dielectric containing structure in a processing chamber;
    heating the substrate to a temperature between about 200° C. and about 400° C.;
    exposing the copper and dielectric containing structure to a hydrogen ($H_2$) gas in the processing chamber; and
    exposing the copper and dielectric containing structure to at least one pulse of an ammonia plasma having a duration of 4 seconds or less in the processing chamber while maintaining the substrate at a temperature between about 200° C. and about 400° C.

2. The method of claim 1, further comprising
    flowing the hydrogen gas into the processing chamber for an anneal treatment time; and
    removing CMP residue during an ammonia plasma treatment time.

3. The method of claim 1, wherein the exposing the copper and dielectric containing structure to the hydrogen gas is conducted using a chamber pressure between 2 Torr and 10 Torr, a substrate temperature of about 350° C., a hydrogen gas flow rate between 1000 sccm and 10,000 sccm, and an annealing treatment time between 1 second and 60 seconds.

4. The method of claim 1, wherein the exposing the copper and dielectric containing structure to the ammonia plasma comprises:
    flowing an ammonia gas into the processing chamber; and
    forming the ammonia plasma from the ammonia gas.

5. The method of claim 4, wherein the ammonia plasma is formed by coupling RF power to the ammonia gas, and wherein the exposing the copper and dielectric containing structure to the ammonia plasma is conducted using a chamber pressure between 2 Torr and 4 Torr, a substrate temperature of about 350° C., a RF power between 300 W and 1000 W, a RF power frequency between 300 kHz and 15 MHz, an ammonia gas flow rate between 1000 sccm and 3000 sccm, a pulse frequency between 1 Hz and 50 kHz.

6. The method of claim 4, wherein the ammonia gas is mixed with a nitrogen ($N_2$) carrier gas.

7. The method of claim 1, further comprising forming a diffusion barrier layer onto the copper and dielectric containing structure.

8. The method of claim 1, wherein exposing the copper and dielectric containing structure to the ammonia plasma occurs during a treatment time, and wherein the copper and dielectric containing structure is exposed to the ammonia plasma for a total time that is a percentage of the treatment time as defined by a duty cycle.

9. The method of claim 8, wherein the treatment time is between 10 seconds and 60 seconds, and wherein the duty cycle is between 5% and 50%.

10. The method of claim 8, wherein the total time is evenly divided into a number of divisions between 2 and 50000, and wherein the divisions are evenly distributed within the treatment time.

11. The method of claim 8, wherein the total time is unevenly divided into a number of divisions between 2 and 50000, and wherein the divisions are unevenly distributed within the treatment time.

12. The method of claim 1, wherein the copper and dielectric containing structure is exposed to the hydrogen gas prior to being exposed to the ammonia plasma.

13. The method of claim 1, wherein heating comprises radiantly heating the substrate using UV radiation.

14. The method of claim 13, the UV radiation has an UV irradiance power between 1000 $W/m^2$ and 2000 $W/m^2$ and UV wavelengths between 200 nm and 400 nm.

15. A method of removing copper oxide from a copper and dielectric containing structure, comprising:
    removing the copper oxide from the copper and dielectric containing structure using a hydrogen ($H_2$) gas, comprising:
        positioning a substrate containing the copper and dielectric containing structure in a processing volume of a processing chamber;
        heating the substrate to a temperature between about 200° C. and about 400° C.;
        flowing the hydrogen gas into the processing volume; and
        exposing the copper and dielectric containing structure to a pulsed ammonia plasma having a duration of 4 seconds or less in the processing chamber to remove CMP residue, comprising:
            maintaining the substrate at a temperature between about 200° C. and about 400° C.;
            flowing an ammonia gas into the processing volume; and
            forming the pulsed ammonia plasma from the ammonia gas.

16. The method of claim 15, wherein the exposing the copper and dielectric containing structure to the hydrogen gas is conducted at a chamber pressure between 2 Torr and 10 Torr, a substrate temperature of about 350° C., a hydrogen gas flow rate between 1000 sccm and 10,000 sccm, and an annealing treatment time between 1 second and 60 seconds.

17. The method of claim 15, wherein the pulsed ammonia plasma is formed by coupling RF power to the ammonia gas, and wherein the exposing the copper and dielectric containing structure to the pulsed ammonia plasma in the processing volume is conducted using a chamber pressure between 2 Torr and 4 Torr, a substrate temperature of about 350° C., a RF power between 300 W and 1000 W, a RF power frequency between 300 kHz and 15 MHz, an ammonia gas flow rate between 1000 sccm and 3000 sccm, a pulse frequency between 1 Hz and 50 kHz.

18. The method of claim 15, wherein exposing the copper and dielectric containing structure to the pulsed ammonia plasma occurs during a treatment time, and wherein the copper and dielectric containing structure is exposed to the pulsed ammonia plasma for a total time that is a percentage of the treatment time as defined by a duty cycle.

19. The method of claim 18, wherein the treatment time is between 10 seconds and 60 seconds, and wherein the duty cycle is between 5% and 50%.

20. The method of claim 19, wherein the total time is evenly divided into a number of divisions between 2 and 50000, and wherein the divisions are evenly distributed within the treatment time.

21. The method of claim 19, wherein the total time is unevenly divided into a number of divisions between 2 and 50000, and wherein the divisions are unevenly distributed within the treatment time.

22. The method of claim 15, wherein heating comprises radiantly heating the substrate using UV radiation.

23. The method of claim 22, the UV radiation has an UV irradiance power between 1000 W/m$^2$ and 2000 W/m$^2$ and UV wavelengths between 200 nm and 400 nm.

24. A method of removing copper oxide from a copper and dielectric containing structure, comprising:

positioning a substrate containing a copper and dielectric containing structure in a processing chamber;

radiantly heating the substrate with a UV source to a temperature between about 200° C. and about 400° C.;

removing copper oxide from the copper and dielectric containing structure using a hydrogen (H$_2$) gas in the processing chamber during an annealing treatment time; and exposing the copper and dielectric containing structure to a pulsed ammonia plasma having a duration of 4 seconds or less during a plasma treatment time in the processing chamber while maintaining the substrate at a temperature between about 200° C. and about 400° C., wherein the copper and dielectric containing structure is exposed to the pulsed ammonia plasma for a total time that is a percentage of the treatment time as defined by a duty cycle, and wherein the total time is divided into divisions distributed within the plasma treatment time.

* * * * *